(12) United States Patent
Koo et al.

(10) Patent No.: US 9,048,975 B2
(45) Date of Patent: Jun. 2, 2015

(54) METHOD AND APPARATUS FOR SOFT-DECISION DETECTION IN 2×2 MIMO SYSTEM

(71) Applicants: SAMSUNG ELECTRONICS CO., LTD., Suwon-Si, Gyeonggi-Do (KR); INDUSTRY-ACADEMIC COOPERATION FOUNDATION, YONSEI UNIVERSITY, Seodaemun-Gu, Seoul (KR)

(72) Inventors: Ji-Hun Koo, Hwaseong-Si (KR); Jang-Yong Park, Seoul (KR); Kil-Hwan Kim, Seoul (KR); Jae-Seok Kim, Seoul (KR)

(73) Assignees: Samsung Electronics Co., Ltd., Suwon-Si, Gyeonggi-do (KR); Industry-Academic Cooperation Foundation, Yonsei University, Seodaemun-gu (KR)

( * ) Notice: Subject to any disclaimer, the term of this patent is extended or adjusted under 35 U.S.C. 154(b) by 0 days.

(21) Appl. No.: 14/213,393

(22) Filed: Mar. 14, 2014

(65) Prior Publication Data

US 2014/0270010 A1    Sep. 18, 2014

(30) Foreign Application Priority Data

Mar. 15, 2013 (KR) .................. 10-2013-0027636

(51) Int. Cl.
| | |
|---|---|
| *H04B 7/02* | (2006.01) |
| *H04L 1/02* | (2006.01) |
| *H04L 1/00* | (2006.01) |
| *H03M 13/11* | (2006.01) |

(52) U.S. Cl.
CPC ............. *H04L 1/00* (2013.01); *H03M 13/1111* (2013.01)

(58) Field of Classification Search
CPC ............... H04B 7/02; H04L 1/02; H04L 1/06
USPC ........................................................ 375/267
See application file for complete search history.

(56) References Cited

U.S. PATENT DOCUMENTS

2013/0287150 A1* 10/2013 Jung et al. ..................... 375/341

* cited by examiner

*Primary Examiner* — Tanmay Shah
(74) *Attorney, Agent, or Firm* — F. Chau & Associates, LLC

(57) ABSTRACT

A method for detecting soft-decisions in a 2×2 MIMO system includes detecting all candidate symbol vector sets S in which there exist all values of a real part and an imaginary part, and calculating a log-likelihood ratio (LLR) with respect to the candidate symbol vector sets S from $$LLR(b_k^j) = \min_{s \in S \cap \beta_{i,k}^-} \frac{ED(s)}{2\sigma_n^2} - \min_{s \in S \cap \beta_{i,k}^+} \frac{ED(s)}{2\sigma_n^2}.$$

19 Claims, 6 Drawing Sheets

METHOD AND APPARATUS FOR SOFT-DECISION DETECTION IN 2×2 MIMO SYSTEM

CROSS-REFERENCE TO RELATED APPLICATION

This application claims priority under 35 USC §119 from Korean Patent Application No. 10-2013-0027636 filed on Mar. 15, 2013 in the Korean Intellectual Property Office (KIPO), and all the benefits accruing therefrom, the contents of which are herein incorporated by reference in their entirety.

BACKGROUND

1. Technical Field

Exemplary embodiments of the present disclosure are directed to methods and apparatuses for soft-decision detection in 2×2 MIMO systems, and more particularly to methods and apparatuses for detecting the soft-decision of a signal modulated through an MDCM (Modified Dual-Carrier modulation), one of precoding modulation schemes in a UWB (ultra-wideband) system based on a 2×2 MIMO (multi-input multi-output) MB-OFDM (multi-band orthogonal frequency division multiplexing) scheme.

2. Discussion of the Related Art

An MB-OFDMA UWB communication system employs an MDCM technology, which is a precoding modulation scheme that can improve PER performance and the receive distance. MDCM technology is a modification of a DCM technology that provides higher speed transmission. MDCM technology combines and converts two independent 16-QAM (quadrature amplitude modulation) symbols into two 256-QAM symbols that are carried on two subcarriers which are spaced apart from each other by the maximum distance of an OFDM symbol. MDCM technology allows diversity gains for different subcarriers to be acquired in one frequency band.

To detect an MDCM signal while acquiring the diversity gains in a receiving stage, an ML (Maximum-Likelihood) scheme may be used. Since a SISO system can detect imaginary and real parts, a SISO system can be implemented without greatly increasing complexity even if a complex ML scheme is used. However, when MDCM technology is applied to a 2×2 MIMO system, the 2×2 MIMO system might not separately detect real and imaginary parts, and the 2×2 MIMO system performs detection similar to a 4×4 MIMO system. Therefore, a 2×2 MIMO system performs detection through an ML scheme or an SD (sphere decoding) scheme used in an existing MIMO system.

Since an ML scheme is complex, an ML scheme might not be implemented in a real system. Although an SD scheme is less complex than an ML scheme, an SD scheme is sequential due to a depth-first scheme. Accordingly, an SD scheme is not suitable for an MDCM-applied 2×2 MIMO system that must process data at a high data rate.

In addition, the MB-OFDM UWB physical layer standard recommends the use of MDCM modulation technology together with LDPC (low-density parity check) channel coding technology. Accordingly, LDPC channel decoding must be performed at the receiver of an MB-OFDM system. Since LDPC channel decoding is performed based on a log-likelihood ratio (LLR) for each encoded bit, a detector for the 2×2 MIMO system employing MDCM transmits a correct LLR value to an LDPC decoder.

A detection scheme that generates an LLR value and transmits the LLR value to a channel decoder is referred to as a soft-decision detection scheme. Although an ML scheme is applicable to a soft-decision detection scheme, and optimal performance can be achieved, the complexity of an ML scheme inhibits implementation. In addition, since an LLR value for soft-decision might not be generated through an SD detection scheme, SD detection impossible may not be possible.

SUMMARY

Some exemplary embodiments provide methods and apparatuses for soft-decision detection in 2×2 MIMO systems capable of generating LLR values, which are not generated through an SD scheme, and which have significantly lower computational complexity than that of the ML scheme.

Some exemplary embodiments provide methods and apparatuses for soft-decision detection in 2×2 MIMO systems capable of facilitating implementation of a decoder in a high-speed 1280+ Mbps transmission mode.

According to exemplary embodiments, a method for detecting soft-decisions in a 2×2 MIMO system, includes detecting all candidate symbol vector sets S for which there exists all values of a real part and an imaginary part; and calculating a log-likelihood ratio (LLR) with respect to the candidate symbol vector sets S from $$LLR(b_k^i) = \min_{s \in S \cap \beta_{i,k}^-} \frac{ED(s)}{2\sigma_n^2} - \min_{s \in S \cap \beta_{i,k}^+} \frac{ED(s)}{2\sigma_n^2},$$

in which $\beta_{i,k}^-$ represents a set having as elements those candidate symbol vectors in set S for which a kth bit of a symbol transmitted through an ith transmitter antenna is 0, $\beta_{i,k}^+$ represents a set having as elements those candidate symbol vectors in set S for which the kth bit of the symbol transmitted through the ith transmitter antenna is 1, $\sigma_n$ represents a standard deviation of additive white Gaussian noise (AWGN), and ED(s) represents a Euclidean distance for an element s of the candidate symbol vector set S.

Each candidate symbol vector set S may be a union $S = S_F \cup S_B$ of a forward candidate symbol vector set $S_F$ and a backward candidate symbol vector set $S_B$.

The method may further comprise forward detecting symbols in an order of $[\hat{S}_2^{n+50}, \hat{S}_2^n]$ and $[\hat{S}_1^{n+50}, \hat{S}_1^n]$, and backward detecting symbols in an order of $[\hat{S}_1^{n+50}, \hat{S}_1^n]$ and $[\hat{S}_2^{n+50}, \hat{S}_2^n]$.

Forward detecting and backward detecting may be performed on a 2×2 matrix based on candidate symbol vector pairs $[\hat{S}_2^{n+50}, \hat{S}_2^n]$ and $[\hat{S}_1^{n+50}, \hat{S}_1^n]$, respectively.

Forward detecting may include selecting p symbols for $\hat{S}_2^{n+50}$; selecting q $\hat{S}_2^n$ symbols for each of the p $\hat{S}_2^{n+50}$ symbols to select a total of p×q $\hat{S}_2^n$ symbols; selecting r additional $\hat{S}_2^n$ symbols; selecting one $\hat{S}_1^{n+50}$ symbol for each of the p×q+r $\hat{S}_2^n$ symbols to select a total of p×q+r $\hat{S}_1^{n+50}$ symbols; and selecting one $\hat{S}_1^n$ symbol for each of the p×q+r $\hat{S}_1^{n+50}$ symbols to select a total of p×q+r $\hat{S}_1^n$ symbols.

Forward detecting the candidate symbol vector pair $[\hat{S}_2^{n+50}, \hat{S}_2^n]$ may include converting a received signal comprising the candidate symbol vector pair $[\hat{S}_2^{n+50}, \hat{S}_2^n]$ into an upper triangular matrix by applying a conjugate transpose of a matrix obtained through QR decomposition to the received signal; calculating a Euclidean distance for all cases of the candidate symbol vector pair $[\hat{S}_2^{n+50}, \hat{S}_2^n]$; selecting L $\hat{S}_2^n$ symbols for the $\hat{S}_2^{n+50}$ from symbol vector pairs $[\hat{S}_2^{n+50}, \hat{S}_2^n]$; determining if values of the real part and the imaginary part exist in the selected $\hat{S}_2^n$ symbols; and selecting an additional $\hat{S}_2^n$ symbol that minimizes the calculated Euclidean distance with respect to a $\hat{S}_2''$ symbol for which the values of the real part and the imaginary part are absent.

The method may further include performing channel ordering for the received signal before forward detecting the candidate symbol vector pair, and applying the conjugate transpose of the matrix obtained through the QR decomposition of a channel matrix to the received signal to convert the received signal to the upper triangular matrix.

Forward detecting the candidate symbol vector pair $[\hat{S}_1^{n+50}, \hat{S}_1'']$ may include applying the conjugate transpose of the matrix obtained through the QR decomposition to the received signal comprising the symbol vector pair $[\hat{S}_1^{n+50}, \hat{S}_1'']$ to convert the received signal into the upper triangular matrix; selecting $\hat{S}_1^{n+50}$ symbols from symbol vector pairs $[\hat{S}_1^{n+50}, \hat{S}_1'']$; and selecting a $\hat{S}_1''$ symbol with respect to each of the selected $\hat{S}_1^{n+50}$ symbols.

The method may further include removing channel interference caused by the selected candidate symbol vector pairs $[\hat{S}_2^{n+50}, \hat{S}_2'']$ before forward detecting the candidate symbol vector pair $[\hat{S}_1^{n+50}, \hat{S}_1'']$, and performing channel ordering for the symbol vector pair $[\hat{S}_1^{n+50}, \hat{S}_1'']$.

Backward detecting may include selecting s symbols for $\hat{S}_1''$ of the symbol vector pair $[\hat{S}_1^{n+50}, \hat{S}_1'']$; selecting one $\hat{S}_2^{n+50}$ symbol for each of the s $\hat{S}_1''$ symbols to select a total of s $\hat{S}_2^{n+50}$ symbols; and selecting one $\hat{S}_2''$ symbol for each of the $\hat{S}_2^{n+50}$ symbols to select a total of s $\hat{S}_2''$ symbols.

Backward detecting the candidate symbol vector pair $[\hat{S}_1^{n+50}, \hat{S}_1'']$ may include converting a received signal comprising the candidate symbol vector pair $[\hat{S}_1^{n+50}, \hat{S}_1'']$ to an upper triangular matrix by applying a conjugate transpose of a matrix obtained through QR decomposition to the received signal; calculating a Euclidean distance for all cases of the candidate symbol vector pair $[\hat{S}_1^{n+50}, \hat{S}_1'']$; and selecting an $\hat{S}_1''$ symbol that minimizes the calculated Euclidean distance with respect to each of $\hat{S}_1''$ symbols for which there exits values of the real part and the imaginary part.

The method may further include performing channel ordering for the received signal before backward detecting the candidate symbol vector pair, and applying the conjugate transpose of the matrix obtained through the QR decomposition of a channel matrix to the received signal to convert the received signal to the upper triangular matrix.

Backward detecting the candidate symbol vector pair $[\hat{S}_2^{n+50}, \hat{S}_2'']$ may include applying the conjugate transpose of the matrix obtained through the QR decomposition to the received signal including the symbol vector pair $[\hat{S}_2^{n+50}, \hat{S}_2'']$ to convert the received signal to the upper triangular matrix; selecting $\hat{S}_2^{n+50}$ symbols from symbol vector pairs $[\hat{S}_2^{n+50}, \hat{S}_2'']$; and selecting a $\hat{S}_2''$ symbol with respect to each of the selected $\hat{S}_2^{n+50}$ symbols.

The method may further include removing channel interference caused by the selected candidate symbol vector pairs $[\hat{S}_1^{n+50}, \hat{S}_1'']$ before backward detecting the candidate symbol vector pair $[\hat{S}_2^{n+50}, \hat{S}_2'']$, and performing channel ordering for the symbol vector pair $[\hat{S}_1^{n+50}, \hat{S}_1'']$.

According to exemplary embodiments, an apparatus for soft-decision detection in a 2×2 MIMO system, includes, a preprocessor configured to perform channel ordering, remove interference, and perform a QR decomposition operation with respect to a channel matrix of a received signal; a forward symbol vector detector configured to detect a symbol vector set $S_F$ comprising candidate symbols for which values of a real part and an imaginary part exist with respect to a first symbol pair according to a forward order based on a result of a forward QR decomposition of the preprocessor; a backward symbol vector detector configured to detect a symbol vector set $S_B$ comprising candidate symbols for which values of a real part and an imaginary part exist with respect to a second symbol pair according to a backward order based on a result of a backward QR decomposition of the preprocessor; and a log-likelihood ratio calculator configured to calculate a log-likelihood ratio with respect to all candidate symbol vector sets $S = S_F \cup S_B$ from $$LLR(b_k^i) = \min_{s \in S \cap \beta_{i,k}^-} \frac{ED(s)}{2\sigma_n^2} - \min_{s \in S \cap \beta_{i,k}^+} \frac{ED(s)}{2\sigma_n^2},$$

in which $\beta_{i,k}^-$ represents a set having as elements those candidate symbol vectors in set S for which a kth bit of a symbol transmitted through an ith transmitter antenna is 0, $\beta_{i,k}^+$ represents a set having as elements those candidate symbol vectors in set S for which the kth bit of the symbol transmitted through the ith transmitter antenna is 1, $\sigma_n$ represents a standard deviation of additive white Gaussian noise (AWGN), and ED(s) represents a Euclidean distance for an element s of the candidate symbol vector set S.

According to exemplary embodiments, a method for detecting soft-decisions in a 2×2 MIMO system includes detecting all candidate symbol vector sets S for which there exist all values of a real part and an imaginary part, wherein each candidate symbol vector set S is a union $S = S_F \cup S_B$, of a forward candidate symbol vector set $S_F$ and a backward candidate symbol vector set $S_B$; forward detecting symbols in an order of $[\hat{S}_2^{n+50}, \hat{S}_2'']$ and $[\hat{S}_1^{n+50}, \hat{S}_1'']$, and backward detecting symbols in an order of $[\hat{S}_1^{n+50}, \hat{S}_1'']$ and $[\hat{S}_2^{n+50}, \hat{S}_2'']$, wherein forward detecting and backward detecting are performed on a 2×2 matrix based on candidate symbol vector pairs $[\hat{S}_2^{n+50}, \hat{S}_2'']$ and $[\hat{S}_1^{n+50}, \hat{S}_1'']$, respectively.

The method may further include calculating a log-likelihood ratio (LLR) with respect to the candidate symbol vector sets S from $$LLR(b_k^i) = \min_{s \in S \cap \beta_{i,k}^-} \frac{ED(s)}{2\sigma_n^2} - \min_{s \in S \cap \beta_{i,k}^+} \frac{ED(s)}{2\sigma_n^2},$$

wherein $\beta_{i,k}^-$ represents a set having as elements those candidate symbol vectors in set S for which a kth bit of a symbol transmitted through an ith transmitter antenna is 0, $\beta_{i,k}^+$ represents a set having as elements those candidate symbol vectors in set S for which the kth bit of the symbol transmitted through the ith transmitter antenna is 1, $\sigma_n$ represents a standard deviation of additive white Gaussian noise (AWGN), and ED(s) represents a Euclidean distance for an element s of the candidate symbol vector set S.

Forward detecting the candidate symbol vector pair $[\hat{S}_2^{n+50}, \hat{S}_2'']$ may include converting a received signal comprising the candidate symbol vector pair $[\hat{S}_2^{n+50}, \hat{S}_2'']$ into an upper triangular matrix by applying a conjugate transpose of a matrix obtained through QR decomposition to the received signal, calculating a Euclidean distance for all cases of the candidate symbol vector pair $[\hat{S}_2^{n+50}, \hat{S}_2'']$, selecting L $\hat{S}_2''$ symbols for the $\hat{S}_2^{n+50}$ from symbol vector pairs $[\hat{S}_2^{n+50}, \hat{S}_2'']$, determining if values of the real part and the imaginary part exist in the selected $\hat{S}_2''$ symbols, and selecting an additional $\hat{S}_2''$ symbol that minimizes the calculated Euclidean distance with respect to a $\hat{S}_2''$ symbol for which the values of the real part and the imaginary part are absent. Forward detecting the candidate symbol vector pair $[\hat{S}_1^{n+50}, \hat{S}_1'']$ may include applying the conjugate transpose of the matrix obtained through the QR decomposition to the received signal comprising the symbol vector pair $[\hat{S}_1^{n+50}, \hat{S}_1'']$ to convert the received signal into the upper triangular matrix, selecting $\hat{S}_1^{n+50}$ symbols from symbol vector pairs $[\hat{S}_1^{n+50}, \hat{S}_1^n]$, and selecting a $\hat{S}_1^n$ symbol with respect to each of the selected $\hat{S}_1^{n+50}$ symbols.

Backward detecting the candidate symbol vector pair $[\hat{S}_1^{n+50}, \hat{S}_1^n]$ may include converting a received signal comprising the candidate symbol vector pair $[\hat{S}_1^{n+50}, \hat{S}_1^n]$ to an upper triangular matrix by applying a conjugate transpose of a matrix obtained through QR decomposition to the received signal, calculating a Euclidean distance for all cases of the candidate symbol vector pair $[\hat{S}_1^{n+50}, \hat{S}_1^n]$, and selecting an $\hat{S}_1^n$ symbol that minimizes the calculated Euclidean distance with respect to each of $\hat{S}_1^n$ symbols for which there exists values of the real part and the imaginary part. Backward detecting the candidate symbol vector pair $[\hat{S}_2^{n+50}, \hat{S}_2^n]$ may include applying the conjugate transpose of the matrix obtained through the QR decomposition to the received signal including the symbol vector pair $[\hat{S}_2^{n+50}, \hat{S}_2^n]$ to convert the received signal to the upper triangular matrix, selectingq $\hat{S}_2^{n+50}$ symbols from symbol vector pairs $[\hat{S}_2^{n+50}, \hat{S}_2^n]$, and selecting an $\hat{S}_2^n$ symbol with respect to each of the selected $\hat{S}_2^{n+50}$ symbols.

As described above, according to an MDCM detection method in a 2×2 MIMO system of exemplary embodiments, the 2×2 MIMO system can perform the soft-decision demodulation of all received MDCM symbols. Accordingly, the demodulator for high-speed 1280+ Mbps transmission mode of can be easily implemented in an MB-OFDM UWB system. In addition, when compared with an ML scheme, soft-decision demodulation requires significantly fewer operations. Accordingly, when an exemplary embodiment is implemented in hardware, system integration can be enhanced, and power consumption can be reduced.

DETAILED DESCRIPTION OF THE EMBODIMENTS

Various exemplary embodiments will be described more fully hereinafter with reference to the accompanying drawings, in which some exemplary embodiments are shown. The present inventive concept may, however, be embodied in many different forms and should not be construed as limited to the exemplary embodiments set forth herein. Like numerals may refer to like elements throughout.

Figure 1:
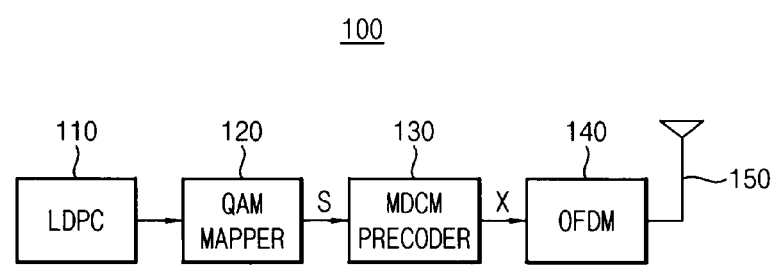
FIG. 1 is a block diagram that schematically illustrates a 2×2 MIMO-OFDM transmission device.

It will be understood that when an element is referred to as being "connected" or "coupled" to another element, it can be directly connected or coupled to the other element or intervening elements may be present. FIG. 1 is a block diagram that schematically illustrates a 2×2 MIMO-OFDM transmission device.

Referring to FIG. 1, the transmission device 100 includes an LDPC (Low Density Parity Code) encoder 110, a constellation mapper 120, an MDCM precoder 130, and an OFD modulator 140. OFDM-modulated signals are transmitted through transmitter antennas 150

Figure 2:
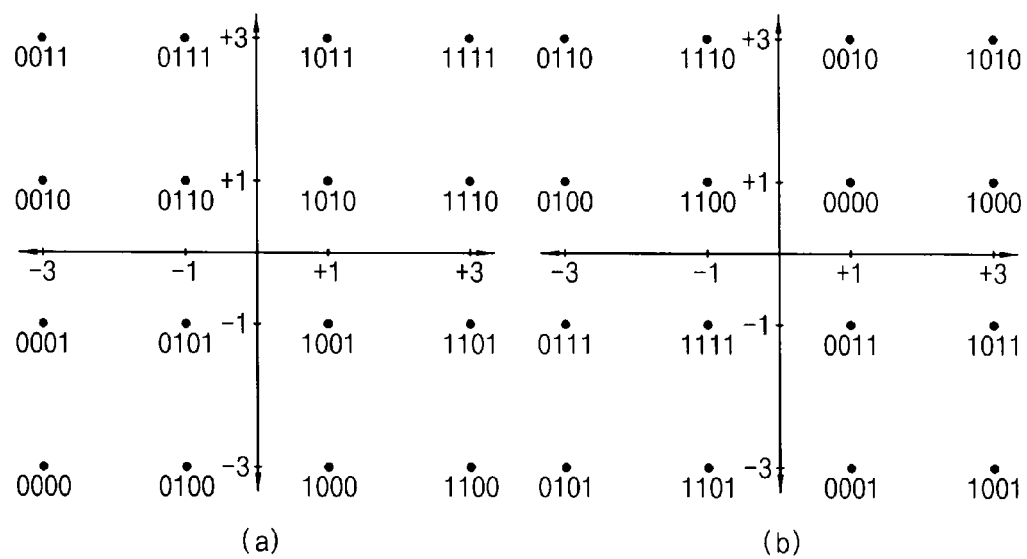
FIG. 2(a) illustrates a 16-QAM constellation to generate the $S^n$ symbol according to one exemplary embodiment.
FIG. 2(b) illustrates a 16-QAM constellation to generate the $S^{n+50}$ symbol according to an exemplary embodiment.

A series of bits, which are LDPC-encoded by the LDPC encoder 110, are grouped such that each group contains 8 bits $b_0, b_1, b_2, b_3, b_4, b_5, b_6$, and $b_7$ for MDCM modulation. The 8 bits are provided to the constellation mapper 120, so that the upper 4 bits $b_0, b_1, b_2$, and $b_3$ are mapped to a 16-QAM symbol and the lower bits $b_4, b_5, b_6$, and $b_7$ are mapped to a 16-QAM symbol $S^{n+50}$. FIG. 2 illustrates 16-QAM constellation diagrams. FIG. 2(a) is a 16-QAM constellation to generate the symbol $S^n$ according to one exemplary embodiment, and FIG. 2(b) is a 16-QAM constellation to generate the symbol $S^{n+50}$ according to an exemplary embodiment.

The generated symbols $S^n$ and $S^{n+50}$ are provided to the MDCM precoder 130 and two 256-QAM symbols as represented by Equation 1:

$$X = \Phi S \quad \quad \text{Equation 1}$$

$$\begin{bmatrix} X^n \\ X^{n+50} \end{bmatrix} = \begin{bmatrix} 4 & 1 \\ 1 & -4 \end{bmatrix} \begin{bmatrix} S^n \\ S^{n+50} \end{bmatrix}.$$

In Equation 1, X, $\Phi$, and S respectively represent an MDCM symbol matrix, a linear precoding matrix, and a 16-QAM symbol matrix. The linear precoding matrix $\Phi$ includes a real number linear dispersion code and a unitary matrix over the integers. The linear precoding matrix $\Phi$ can ensure a simple precoding process implementation due to the integers while maintaining the power spectrum density (PSD) characteristics of the transmitted signal $X^n$ and $X^{n+50}$ are MDCM symbols that have the same constellation as a 256-QAM constellation. $X^n$ and $X^{n+50}$ are provided to the OFDM modulator 140 and are transmitted by subcarriers spaced apart by 50 OFDM symbols. In this case, n represents a subcarrier index. In a 2×2 MIMO system, MDCM modulation is performed with respect to each stream as shown in the above procedure, and an MDCM symbol is OFDM-modulated with respect to each symbol and transmitted.

Figure 3:
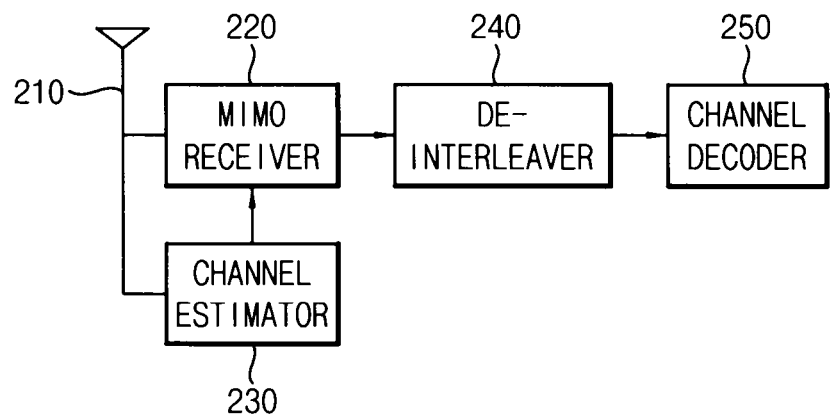
FIG. 3 is a block diagram that schematically shows a 2×2 MIMO-OFDM reception device.

FIG. 3 is a block diagram that schematically shows a 2×2 MIMO-OFDM reception device 200.

Referring to FIG. 3, a 2×2 MIMO-OFDM reception device 200 includes a plurality of receiver antennas 210, a MIMO receiver 220, a channel estimator 230, a de-interleaver 240, and a channel decoder 250. Signals received through the receiver antennas 210 are transmitted to the MIMO receiver 220 and the channel estimator 230. The channel estimator 230 estimates a channel matrix between the transmitter antennas 150 of the transmission device 100 and the receiver antennas of the reception device 200 and outputs the channel matrix to the MIMO receiver 220. The MIMO receiver 220 detects a received signal vector corresponding to a signal detection scheme suggested in an exemplary embodiment and a transmitted symbol using the estimated channel matrix output from the channel estimator 230, calculates an LLR value for each transmitted bit included in the transmitted symbol vector, and outputs the LLR value to the de-interleaver 240. After de-interleaving LLR values received from the MIMO receiver 220 that correspond to a preset de-interleaving scheme, the de-interleaver 240 outputs the de-interleaved LLR value to the channel decoder 250. The channel decoder 250 soft-decision decodes the LLR values received from the de-interleaver 240 to recover the LLR value from an information bit string of the transmitted signal.

Figure 4:
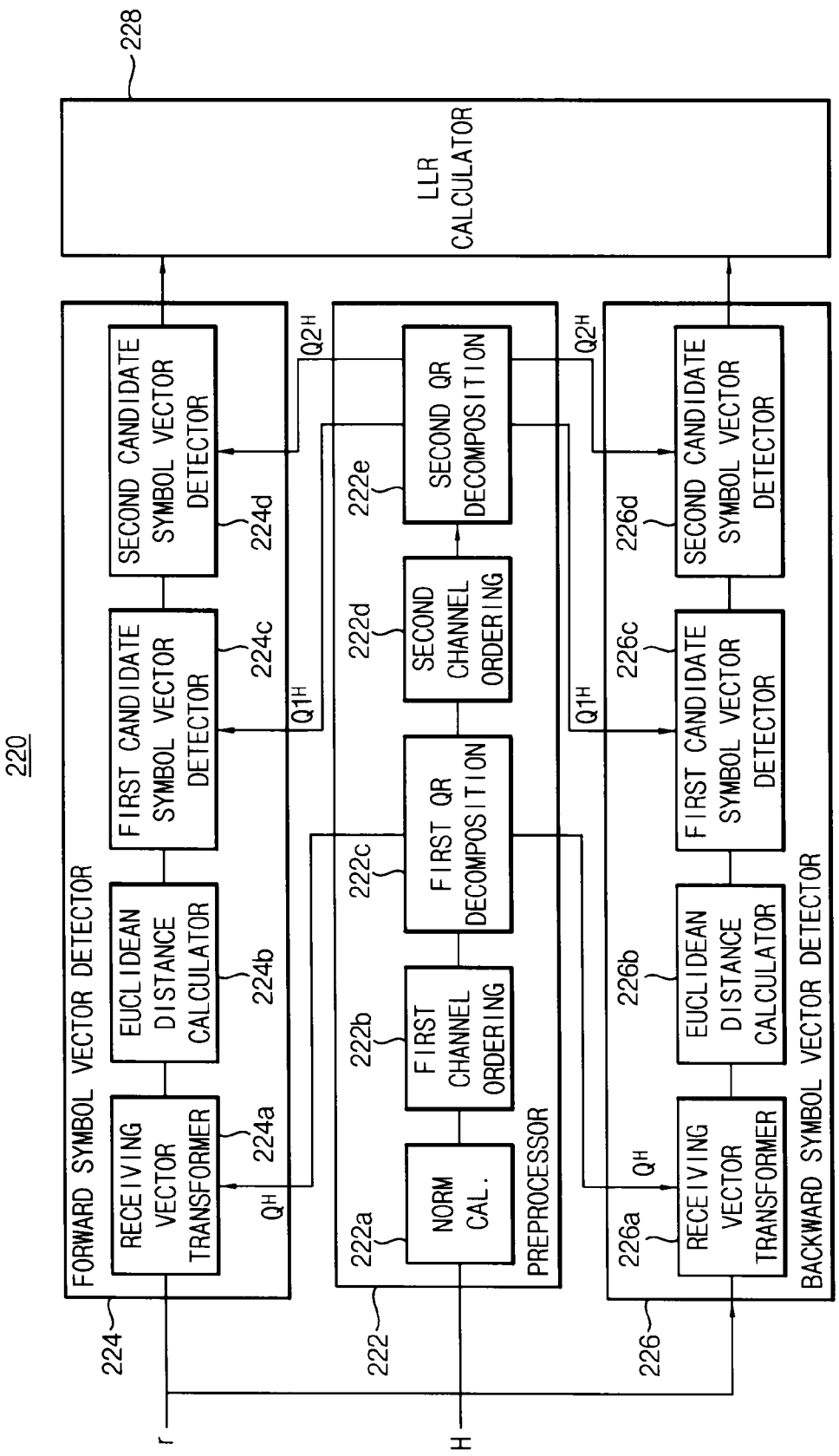
FIG. 4 is a block diagram that illustrates the internal structure of an MIMO receive block according to exemplary embodiments.

FIG. 4 is a block diagram that illustrates the internal structure of the MIMO receiver 220 according to exemplary embodiments.

Referring to FIG. 4, the MIMO receiver 220 includes a preprocessor 222, a forward symbol vector detector 224, a backward symbol vector detector 226, and an LLR calculator 228.

The preprocessor 222 includes a norm calculator 222a, a first channel ordering unit 222b, a first QR decomposition unit 222c, a second channel ordering unit 222d, and a second QR decomposition unit 222e. The preprocessor 222 receives a channel matrix H estimated by the channel estimator 230 to calculate a norm, and performs a channel ordering process and a QR decomposition process to generate matrixes $Q^H$, $Q^1$, and $Q^2$.

The forward symbol vector detector 224 includes a receiving vector transformer 224a, a Euclidean distance calculator 224b, a first candidate symbol vector detector 224c, and a second candidate symbol vector detector 224d.

The backward symbol vector detector 226 includes a receiving vector transformer 226a, a Euclidean distance calculator 226b, a first candidate symbol vector detector 226c, and a second candidate symbol vector detector 226d.

1. Selection of a Forward Candidate Symbol Vector

The term "forward" refers to a direction for detecting symbols of a candidate symbol vector in order of $\hat{S}_2^{n+50}$, $\hat{S}_2^{n}$, $\hat{S}_1^{n+50}$, and $\hat{S}_1^{n}$. A process of forward detection may be summarized as follows. First, select p symbols for $\hat{S}_2^{n+50}$, and then select q $\hat{S}_2^{n}$ symbols for each of the p $\hat{S}_2^{n+50}$ symbols to select total p×q $\hat{S}_2^{n}$ symbols. Next, select r additional $\hat{S}_2^{n}$ symbols, select one $\hat{S}_1^{n+50}$ symbol for each of the p×q+r $\hat{S}_2^{n}$ symbols to select a total of p×q+r $\hat{S}_1^{n+50}$ symbols, and then select one $\hat{S}_1^{n}$ symbol for each of the p×q+r $\hat{S}_1^{n+50}$ symbols to select a total of p×q+r $\hat{S}_1^{n}$ symbols. Details of these steps are provided as follows.

In a 2×2 MIMO system, the received MDCM symbols may be represented by Equation 2:

$$Y = HX + N \quad \text{Equation 2}$$

$$\begin{bmatrix} Y_1^n \\ Y_2^n \\ Y_1^{n+50} \\ Y_2^{n+50} \end{bmatrix} = \begin{bmatrix} H_{11}^n & H_{12}^n & 0 & 0 \\ H_{21}^n & H_{22}^n & 0 & 0 \\ 0 & 0 & H_{11}^{n+50} & H_{12}^{n+50} \\ 0 & 0 & H_{21}^{n+50} & H_{22}^{n+50} \end{bmatrix} \begin{bmatrix} X_1^n \\ X_2^n \\ X_1^{n+50} \\ X_2^{n+50} \end{bmatrix} + \begin{bmatrix} N_1^n \\ N_2^n \\ N_1^{n+50} \\ N_2^{n+50} \end{bmatrix}.$$

In equation 2, $X_i^n$ represents an MDCM symbol modulated to an $n^{th}$ subcarrier in an $i^{th}$ transmit antenna, and $Y_i^n$ represents a received signal demodulated from the $n^{th}$ subcarrier at an $i^{th}$ receive antenna.

The norm calculator 222a calculates norm values of a column vector H through Equation 2.

The first channel ordering unit 222b changes the element order of the column vector of a channel so that the minimum value of the calculated norm values is placed in the second row or the fourth row. If there exists a column vector that has the minimum norm value in the second or fourth rows, there is no change to the element order of the column vector. If there exists a column vector that has the minimum norm value in the first or third rows, the element order of the column vector is changed to exchange the element of the first row with the element of the second row, and exchange the element of the third row with the element of the fourth row.

This is expressed as a following equation:

$$H = [h_1, h_2, h_3, h_4],$$

if $\min_i \|h_i\|^2 \in [1,3]$ $$\begin{cases} H_{ordered}^F = [h_2, h_1, h_4, h_3] \\ H_{ordered}^I = [h_1, h_2, h_3, h_4], \end{cases}$$

and if $\min_i \|h_i\|^2 \in [2,4]$ $$\begin{cases} H_{ordered}^F = [h_1, h_2, h_3, h_4] \\ H_{ordered}^I = [h_2, h_1, h_4, h_3]. \end{cases}$$

Channel ordering first detects a transmitted symbol from a signal received from a receiver antenna estimated as having the most deteriorated channel state, and then detects the transmitted symbols in the order of signals received through antennas estimated as having superior channel states. The following description assumes that the signals of Equation 2 have undergone channel ordering.

The first QR decomposition unit 222c divides the ordered channels into first and second rows and third and fourth rows to perform QR decomposition. In other words, the first QR decomposition unit 222c performs QR decomposition based on an MGS (Modified Gramm-Schmidt) orthogonalization scheme. This is summarized in the form of a matrix and expressed as Equation 3:

$$[Q^n, R^n] = QR \begin{bmatrix} H_{11}^n & H_{12}^n \\ H_{21}^n & H_{22}^n \end{bmatrix} \quad \text{Equation 3}$$

$$[Q^{n+50}, R^{n+50}] = QR \begin{bmatrix} H_{11}^{n+50} & H_{12}^{n+50} \\ H_{21}^{n+50} & H_{22}^{n+50} \end{bmatrix}.$$

The matrix Q is a unitary matrix, in that $Q^H \times Q = I$, where I is an identity matrix and $Q^H$ is a conjugate transpose of matrix Q.

$Q^{n^H}$ and $Q^{n+50^H}$ obtained from the first QR decomposition unit 222c are provided to the receiving vector transformer 224a of the forward symbol vector detector 224. The receiving vector transformer 224a multiplies the conjugate transposes $Q^{n^H}$ and $Q^{n+50^H}$ of $Q^n$ and $Q^{n+50}$ by the received signal through a QR decomposition to obtain a converted received vector Z shown in Equation 4:

$$\begin{bmatrix} Z_1^n \\ Z_2^n \\ Z_1^{n+50} \\ Z_2^{n+50} \end{bmatrix} = \begin{bmatrix} Q^{nH} & O_{2\times 2} \\ O_{2\times 2} & Q^{n+50H} \end{bmatrix} \begin{bmatrix} Y_1^n \\ Y_2^n \\ Y_1^{n+50} \\ Y_2^{n+50} \end{bmatrix} \quad \text{Equation 4}$$

$$= \begin{bmatrix} R_{11}^n & R_{12}^n & 0 & 0 \\ 0 & R_{22}^n & 0 & 0 \\ 0 & 0 & R_{11}^{n+50} & R_{12}^{n+50} \\ 0 & 0 & 0 & R_{22}^{n+50} \end{bmatrix} \begin{bmatrix} X_1^n \\ X_2^n \\ X_1^{n+50} \\ X_2^{n+50} \end{bmatrix} +$$

$$\begin{bmatrix} N_1^n \\ N_2^n \\ N_1^{n+50} \\ N_2^{n+50} \end{bmatrix}.$$

In this case, the matrix R is an upper triangular matrix that facilitates the removal of interference from an antenna.

Since the second and fourth rows in Equation 4 are independent from the first and third rows, the second and fourth rows may be separated from the first and third rows as expressed in Equation 5:

$$\begin{bmatrix} Z_2^n \\ Z_2^{n+50} \end{bmatrix} = \begin{bmatrix} R_{22}^n & 0 \\ 0 & R_{22}^{n+50} \end{bmatrix} \begin{bmatrix} X_2^n \\ X_2^{n+50} \end{bmatrix} + \begin{bmatrix} N_2^n \\ N_2^{n+50} \end{bmatrix}. \quad \text{Equation 5}$$

Since the $X_2^n$, and $X_2^{n+50}$ have an MDCM relation in Equation 5, Equation 5 may be expressed as Equation 6:

$$\begin{bmatrix} Z_2^n \\ Z_2^{n+50} \end{bmatrix} = \begin{bmatrix} R_{22}^n & 0 \\ 0 & R_{22}^{n+50} \end{bmatrix} \begin{bmatrix} 4 & 1 \\ 1 & -4 \end{bmatrix} \begin{bmatrix} S_2^n \\ S_2^{n+50} \end{bmatrix} + \begin{bmatrix} N_2^n \\ N_2^{n+50} \end{bmatrix}. \quad \text{Equation 6}$$

The second channel ordering unit $222d$ of the preprocessor 222 performs an ordering that places the greater of $R_{22}^n$ and $R_{22}^{n+50}$ in Equation 6 in the first row. Accordingly, performance degradation resulting from error transfer is minimized. The following description assumes that channel ordering is achieved as expressed by Equation 6.

As expressed by Equations 6 and 7, the second QR decomposition unit $222e$ of the preprocessor 222 performs another QR decomposition.

$$[Q1, R1] = QR \left\{ \begin{bmatrix} R_{22}^n & 0 \\ 0 & R_{22}^{n+50} \end{bmatrix} \begin{bmatrix} 4 & 1 \\ 1 & -4 \end{bmatrix} \right\} \quad \text{Equation 7}$$

Figure 7:
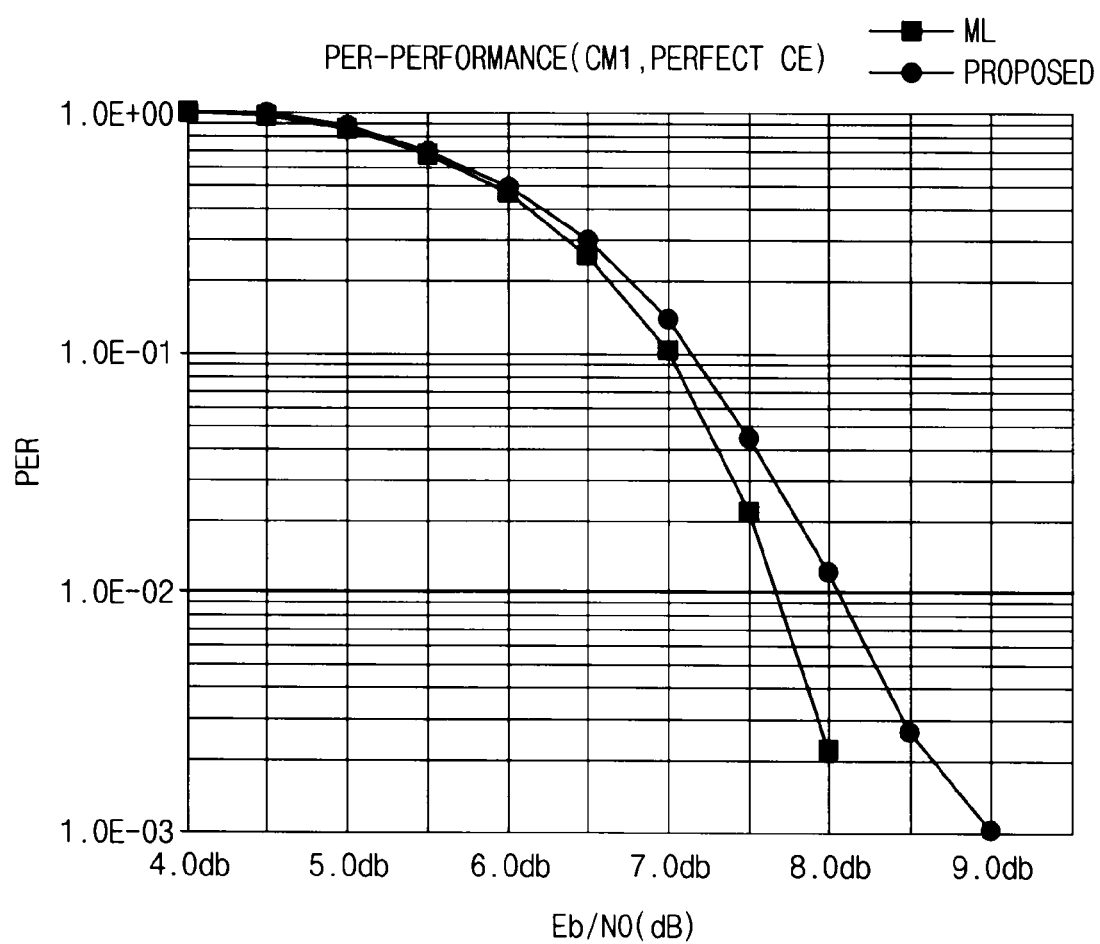
FIG. 7 is a graph that illustrates a packet error rate for the same simulation performance result as that of FIG. 6.

Since the diagonal elements $R_{22}^n$ and $R_{22}^{n+50}$ of matrix R that result from the QR decomposition in Equation 3 have real values, and all elements of a linear precoding matrix have real values, all elements resulting from the QR decomposition in FIG. 7 have real values.

The conjugate transpose $Q1^H$ of matrix Q1 is provided to the first candidate symbol vector detector $224c$ of the forward symbol vector detector 224. Accordingly, Equation 6 may be re-expressed as Equation 8 in the first candidate symbol vector detector $224c$.

$$\begin{bmatrix} Z_2^n \\ Z_2^{n+50} \end{bmatrix} = Q_1^H \begin{bmatrix} Z_2^n \\ Z_2^{n+50} \end{bmatrix} \quad \text{Equation 8}$$

$$= \begin{bmatrix} R'_{11} & R'_{12} \\ 0 & R'_{22} \end{bmatrix} \begin{bmatrix} S_2^n \\ S_2^{n+50} \end{bmatrix} + \begin{bmatrix} N_2^n \\ N_2^{n+50} \end{bmatrix}.$$

The matrix R' is an upper triangular matrix that facilitates the removal of interference from the antenna.

The Euclidean distance calculator $224b$ of the forward symbol vector detector 224 finds Euclidean distances for all symbol vectors $s^1=[S_2^n, S_2^{n+50}]$ expressed in Equation 8. The equation for finding the Euclidean distances may be expressed as Equation 9:

$$ED_{S_2^n, S_2^{n+50}} = \|Z_2^{n+50} - R'_{22}S_2^{n+50}\|^2 + \|Z_2^n - R'_{11}S_2^n - R'_{12}S_2^{n+50}\|^2. \quad \text{Equation 9}$$

Since all elements of the matrices Q and R that result from the QR decomposition of Equation 7 are real numbers, all elements $R'_{11}$, $R'_{12}$, and $R'_{22}$ of the matrix R are real numbers. Accordingly, Equation 9 may be divided into a real part and an imaginary part as expressed in Equation 10:

$$ED_{S_2^n, S_2^{n+50}} = \|\text{Re}[Z_2^{n+50}] - R'_{22}\text{Re}[S_2^{n+50}]\|^2 + \quad \text{Equation 10}$$
$$\|\text{Re}[Z_2^n] - R'_{11}\text{Re}[S_2^n] - R'_{12}\text{Re}[S_2^{n+50}]\|^2 +$$
$$\|\text{Im}[Z_2^{n+50}] - R'_{22}\text{Im}[S_2^{n+50}]\|^2 +$$
$$\|\text{Im}[Z_2^n] - R'_{22}\text{Im}[S_2^n] - R'_{12}\text{Im}[S_2^{n+50}]\|^2.$$

Since all elements of the symbol vector $s^1=[S_2^n, S_2^{n+50}]$ have 16-QAM symbols, the number of cases of the real and imaginary parts of each symbol corresponds to $\text{Re}[S]\in[-3,-1,1,3]$, and $\text{Im}[S]\in[-3,-1,1,3]$. Accordingly, the first and third norms of Equation 10 have four cases, and the second and fourth norms of Equation 10 have 16 cases.

Accordingly, the number of multiplications required to calculate the Euclidean distances for all cases of the symbol vector $s^1=[S_2^n, S_2^{n+50}]$ in Equation 10 is $4\times 2+16\times 2=40$ in total.

The first candidate symbol vector detector $224c$ of the forward symbol vector detector 224 detects $\hat{S}_2^n$ using a scheme shown in Equation. 11 with respect to all cases of $S_2^{n+50}$, that is, all 16-QAM symbols:

$$\hat{S}_2^n = Q_1\left(\frac{Z_2^n - R'_{12}\hat{S}_2^{n+50}}{R'_{11}}\right). \quad \text{Equation 11}$$

$Q_1(\ )$ is a slicing function that selects L 16-QAM symbols that best approximate parameters in brackets using Equation 11.

The following description of an exemplary embodiment assumes that L=4.

In other words, four symbols $\hat{S}_2^n$ are selected with respect to one symbol $\hat{S}_2^{n+50}$. Accordingly, the total number of cases for a candidate symbol vector $s^1=[S_2^n, S_2^{n+50}]$ is 64.

In addition, an LLR value may be calculated using another equation. Letting the Euclidean distance for elements $s=[\hat{S}_2^{n+50}, \hat{S}_2^n, \hat{S}_1^{n+50}, \hat{S}_1^n]$ of a set S be ED(s), the LLR value may be expressed by Equation 12:

$$LLR(b_k^i) = \min_{s \in S \cap \beta_{i,k}^-} \frac{ED(s)}{2\sigma_n^2} - \min_{s \in S \cap \beta_{i,k}^+} \frac{ED(s)}{2\sigma_n^2}. \quad \text{Equation 12}$$

In Equation 12, k represents a bit index of a symbol, and has a value in the range of 0 to 7. $\sigma_n$ represents a standard deviation of additive white Gaussian noise (AWGN).

$\beta_{i,k}^-$ is a set of cases of a symbol vector $[\hat{S}_2^{n+50}, \hat{S}_2^n, \hat{S}_1^{n+50}, \hat{S}_1^n]$ in which a $k^{th}$ bit of an $i^{th}$ transmitted symbol is 0. $\beta_{i,k}^+$ is a set of cases of a symbol vector $[\hat{S}_2^{n+50}, \hat{S}_2^n, \hat{S}_1^{n+50}, \hat{S}_1^n]$ in which a $k^{th}$ bit of an transmitted symbol is 1.

If the intersection of the candidate symbol vector set S with either the set $\beta_{i,k}^-$ or the set $\beta_{i,k}^+$ is an empty set, the LLR value may not be calculated. Therefore, a symbol vector is added such that the intersection is not an empty set.

To prevent the value of an opposite bit from being absent when calculating the LLR value, it is determined whether all values of the real and imaginary parts of the candidate symbol $\hat{S}_2^n$ of the 16-QAM candidate symbol vector are in $\{-3, -1, 1, 3\}$, and with respect to the absent value, a symbol vector having the minimum Euclidean distance calculated from Equation 10 is additionally selected as a candidate symbol vector.

According to an experimental result, the number of elements of the candicate symbol vector $\hat{S}_2^n$ is 67.

Through the above scheme, 16 candidate symbol vectors for the symbol $\hat{S}_2^{n+50}$, and 67 candidate symbol vectors for the symbol $\hat{S}_2^n$ are primarily selected.

If the second candidate symbol vector detector 224d of the forward symbol vector detector 224 terminates detection of the primary candidate symbol vector, the second candidate symbol vector detector 224d removes interference with respect to the candidate symbol vector $s^1 = [S_2^n, S_2^{n+50}]$ as expressed by Equation 13 using Equation 4:

$$\begin{bmatrix} Z_1^n \\ Z_1^{n+50} \end{bmatrix} = \begin{bmatrix} Z_1^n \\ Z_1^{n+50} \end{bmatrix} - \begin{bmatrix} R_{12}^n & 0 \\ 0 & R_{12}^{n+50} \end{bmatrix} \begin{bmatrix} 4 & 1 \\ 1 & -4 \end{bmatrix} \begin{bmatrix} \hat{S}_2^n \\ \hat{S}_2^{n+50} \end{bmatrix} \quad \text{Equation 13}$$

$$= \begin{bmatrix} R_{11} & 0 \\ 0 & R_{11}^{n+50} \end{bmatrix} \begin{bmatrix} 4 & 1 \\ 1 & -4 \end{bmatrix} \begin{bmatrix} S_1^n \\ S_1^{n+50} \end{bmatrix} + \begin{bmatrix} N_1^n \\ N_1^{n+50} \end{bmatrix}.$$

The second QR decomposition unit 222e performs QR decomposition with respect to a portion of Equation 13 corresponding to a channel as expressed by Equation 14:

$$[Q2, R2] = QR\left\{ \begin{bmatrix} R_{11}^n & 0 \\ 0 & R_{11}^{n+50} \end{bmatrix} \begin{bmatrix} 4 & 1 \\ 1 & -4 \end{bmatrix} \right\}. \quad \text{Equation 14}$$

The ordering process places the greater of $R_{11}^n$, and $R_{11}^{n+50}$ of Equation 14 in the second row. The following description assumes that channel ordering is achieved as expressed by Equation 13.

The second candidate symbol vector detector 224d of the forward symbol vector detector 224 receives the conjugate transpose $Q2^H$ of the matrix Q2, and Equation 13 may be re-expressed as Equation 15:

$$\begin{bmatrix} Z_1^n \\ Z_1^{n+50} \end{bmatrix} = Q2^H \begin{bmatrix} Z_1^n \\ Z_1^{n+50} \end{bmatrix} \quad \text{Equation 15}$$

-continued
$$= \begin{bmatrix} R_{11}'' & R_{12}'' \\ 0 & R_{22}'' \end{bmatrix} \begin{bmatrix} S_1^n \\ S_1^{n+50} \end{bmatrix} + \begin{bmatrix} N_1^n \\ N_1^{n+50} \end{bmatrix}.$$

In this case, the matrix R″ is an upper triangular matrix that facilitates the removal of interference from an antenna.

The second row of Equation 15 may be expressed as Equation 16, to detect the symbol $\hat{S}_1^{n+50}$:

$$\hat{S}_1^{n+50} = Q_2\left(\frac{Z_1^{n+50}}{R_{22}''}\right) \quad \text{Equation 16}$$

In Equation 16, $Q_2( )$ is a slicing function that selects one 16-QAM symbol that best approximates parameters in brackets. A symbol vector $s^2 = [\hat{S}_2^{n+50}, \hat{S}_2^n, \hat{S}_1^{n+50}]$ that includes the detected symbol $\hat{S}_1^{n+50}$ is generated. Equation 17 is performed with respect to the symbol $\hat{S}_1^{n+50}$ detected as the candidate.

$$\hat{S}_1^n = Q_1\left(\frac{Z_2^n - R_{12}''\hat{S}_1^{n+50}}{R_{11}''}\right) \quad \text{Equation 17}$$

In Equation 17, $Q_2( )$ is a slicing function that selects one 16-QAM symbol that best approximates parameters in brackets. Accordingly, one symbol $\hat{S}_1^n$ is detected with respect to symbol $\hat{S}_1^{n+50}$.

Accordingly, if the detected $\hat{S}_1^n$ is included in the candidate symbol vectors $s^2 = [\hat{S}_2^{n+50}, \hat{S}_2^n, \hat{S}_1^{n+50}]$, four symbol vectors $[\hat{S}_2^{n+50}, \hat{S}_2^n, \hat{S}_1^{n+50}, \hat{S}_1^n]$ comprise one forward vector. A candidate symbol vector set $S_F$ having the above vectors as elements may be expressed by Equation 18:

$$[\hat{S}_2^{n+50}, \hat{S}_2^n, \hat{S}_1^{n+50}, \hat{S}_1^n] \in S_F \quad \text{Equation 18}$$

2. Selection of a Backward Candidate Symbol Vector

The term "backward" refers to a direction for detecting symbols of a candidate symbol vectors in order of $\hat{S}_1^{n+50}$, $\hat{S}_1^n$, $\hat{S}_2^{n+50}$, and $\hat{S}_2^n$. A process of backward detection may be summarized as follows. First, select s symbols for $\hat{S}_1^n$ of the symbol vector pair $[\hat{S}_1^{n+50}, \hat{S}_1^n]$, next select one $\hat{S}_2^{n+50}$ symbol for each of the s $\hat{S}_1^n$ symbols to select a total of s $\hat{S}_2^{n+50}$ symbols, and then select one $\hat{S}_2^n$ symbol for each of the s $\hat{S}_2^{n+50}$ symbols to select a total of s $\hat{S}_2^n$ symbols. Details of these steps are provided as follows.

The symbol vector set $S_F$ includes all symbol vectors in which the values of real and imaginary parts of $\hat{S}_2^{n+50}$ are in $\{-3, -1, 1, \text{and } 3\}$ without omission. In addition, the symbol vector set $S_F$ includes all symbol vectors in which the values of real and imaginary parts of $\hat{S}_2^n$ are in $\{-3, -1, 1, \text{and } 3\}$ without omission. In other words, the symbol vector set $S_F$ includes all cases of $\hat{S}_2^{n+50}$. In the case of the $\hat{S}_2^n$, values that do not exist in an intermediate process are included in the candidate symbol vector.

However, it cannot be determined whether the symbol vector set $S_F$ includes all symbol vectors in which the values of real and imaginary parts of the $\hat{S}_2^{n+50}$ are in $\{-3, -1, 1, \text{and } 3\}$ without omission. Similarly, it cannot be determined whether the symbol vector set $S_F$ includes all symbol vectors in which the values of real and imaginary parts of the $\hat{S}_2^n$ are in $\{-3, -1, 1, \text{and } 3\}$ without omission.

Accordingly, since there is no opposite bit value when a soft-decision process is performed, an LLR value may not be found.

To address this issue, the above process is inversly performed, so that symbol vectors exist for which the values of the real and imaginary parts of $\hat{S}_1^{n+50}$, and $\hat{S}_1^n$ are in $\{-3, -1, 1, \text{ and } 3\}$ without omission.

Since the inverse process is performed with respect to the symbol vectors in which the values of the real and imaginary parts of the $\hat{S}_1^{n+50}$, and the $\hat{S}_1^n$ are in $\{-3, -1, 1, \text{ and } 3\}$ without omission, the inverse process is similar to the forward process. However, a smaller number of symbol vectors are present in the inverse process.

As described above, the first channel ordering unit 222b of the preprocessor 222 exchanges the position of the first row with the position of the second row in Equation 2 according to the inverse channel ordering, and exchanges the position of the third row with the position of the fourth row as expressed in Equation 19:

$$\begin{bmatrix} Y_1^n \\ Y_2^n \\ Y_1^{n+50} \\ Y_2^{n+50} \end{bmatrix} = \begin{bmatrix} H_{12}^n & H_{11}^n & 0 & 0 \\ H_{22}^n & H_{21}^n & 0 & 0 \\ 0 & 0 & H_{12}^{n+50} & H_{11}^{n+50} \\ 0 & 0 & H_{22}^{n+50} & H_{21}^{n+50} \end{bmatrix} \begin{bmatrix} X_2^n \\ X_1^n \\ X_2^{n+50} \\ X_1^{n+50} \end{bmatrix} + \begin{bmatrix} N_1^n \\ N_2^n \\ N_1^{n+50} \\ N_2^{n+50} \end{bmatrix}. \quad \text{Equation 19}$$

The first QR decomposition unit 222c performs QR decomposition with respect to the channel matrix of Equation. 19, and the channel matrix may be expressed as in Equation. 20:

$$[Q_I^n, R_I^n] = QR \begin{bmatrix} H_{12}^n & H_{11}^n \\ H_{22}^n & H_{21}^n \end{bmatrix}$$

$$[Q_I^{n+50}, R_I^{n+50}] = QR \begin{bmatrix} H_{12}^{n+50} & H_{11}^{n+50} \\ H_{22}^{n+50} & H_{21}^{n+50} \end{bmatrix}. \quad \text{Equation 20}$$

The receiving vector transformer 226a of the backward symbol vector detector 226 multiplies the channel matrix of Equation 19 by the conjugate transposes of $Q_1^n$, and $Q_1^{n+50}$, and the multiplication result may be expressed as Equation 21:

$$\begin{bmatrix} Z_{I,1}^n \\ Z_{I,2}^n \\ Z_{I,1}^{n+50} \\ Z_{I,2}^{n+50} \end{bmatrix} = \begin{bmatrix} Q_I^{nH} & 0_{2\times2} \\ 0_{2\times2} & Q_I^{n+50H} \end{bmatrix} \begin{bmatrix} Y_1^n \\ Y_2^n \\ Y_1^{n+50} \\ Y_2^{n+50} \end{bmatrix} \quad \text{Equation 21}$$

$$= \begin{bmatrix} R_{I,11}^n & R_{I,12}^n & 0 & 0 \\ 0 & R_{I,22}^n & 0 & 0 \\ 0 & 0 & R_{I,11}^{n+50} & R_{I,12}^{n+50} \\ 0 & 0 & 0 & R_{I,22}^{n+50} \end{bmatrix} \begin{bmatrix} X_2^n \\ X_1^n \\ X_2^{n+50} \\ X_1^{n+50} \end{bmatrix} +$$

$$\begin{bmatrix} N_{I,1}^n \\ N_{I,2}^n \\ N_{I,1}^{n+50} \\ N_{I,2}^{n+50} \end{bmatrix}.$$

Since the second and fourth rows in Equation 21 are independent from the first and third rows, the second and fourth rows in Equation 21 may be expressed as Equation 22:

$$\begin{bmatrix} Z_{I,2}^n \\ Z_{I,2}^{n+50} \end{bmatrix} = \begin{bmatrix} R_{I,22}^n & 0 \\ 0 & R_{I,22}^{n+50} \end{bmatrix} \begin{bmatrix} X_1^n \\ X_1^{n+50} \end{bmatrix} + \begin{bmatrix} N_{I,2}^n \\ N_{I,2}^{n+50} \end{bmatrix}. \quad \text{Equation 22}$$

Since the $X_1^n$ and the $X_1^{n+50}$ in Equation 22 have an MDCM relation, the $X_1^n$ and the $X_1^{n+50}$ may be expressed as Equation 23:

$$\begin{bmatrix} Z_{I,2}^n \\ Z_{I,2}^{n+50} \end{bmatrix} = \begin{bmatrix} R_{I,22}^n & 0 \\ 0 & R_{I,22}^{n+50} \end{bmatrix} \begin{bmatrix} 4 & 1 \\ 1 & -4 \end{bmatrix} \begin{bmatrix} S_1^n \\ S_1^{n+50} \end{bmatrix} + \begin{bmatrix} N_{I,2}^n \\ N_{I,2}^{n+50} \end{bmatrix}. \quad \text{Equation 23}$$

The second QR decomposition unit 222e of the preprocessor 222 performs the QR decomposition as expressed in Equations 23 and 24.

$$[Q1_I, R1_I] = QR \left\{ \begin{bmatrix} R_{I,22}^n & 0 \\ 0 & R_{I,22}^n \end{bmatrix} \begin{bmatrix} 4 & 1 \\ 1 & -4 \end{bmatrix} \right\}. \quad \text{Equation 24}$$

If Equation 23 is multiplied by the conjugate transpose of $Q1_1$ obtained from Equation 24, Equation 23 may be expressed as Equation 25:

$$\begin{bmatrix} Z_{I,2}^n \\ Z_{I,2}^{n+50} \end{bmatrix} = \begin{bmatrix} R'_{I,11} & R'_{I,12} \\ 0 & R'_{I,22} \end{bmatrix} \begin{bmatrix} S_1^n \\ S_1^{n+50} \end{bmatrix} + \begin{bmatrix} N_{I,2}^n \\ N_{I,2}^{n+50} \end{bmatrix}. \quad \text{Equation 25}$$

The Euclidean distance calculator 226b finds the Euclidean distances for all $S_1^n$ and $S_1^{n+50}$ in Equation 25. This may be expressed as Equation 26:

$$ED_{s_1^n, s_1^{n+50}} = \|Z_{I,2}^{n+50} - R'_{I,22} S_1^{n+50}\|^2 + \|Z_{I,2}^n - R'_{I,11} S_1^{n+50} - R'_{I,12} S_1^{n+50}\|^2. \quad \text{Equation 26}$$

Through Equation 26, the Euclidean distances for all symbol vectors of $s_I^1 = [S_1^n, S_1^{n+50}]$ can be found using 40 multiplication operations based on Equation 10 and the above-described scheme.

The first candidate symbol vector detector 226c of the backward symbol vector detector 226 selects a symbol vector $s_I^1 = [S_1^n, S_1^{n+50}]$ having a minimum Euclidean distance calculated by Equation 25 as a candidate symbol vector when the values of the real and imaginary parts of the $S_1^n$ are in $\{-3, -1, 1, \text{ and } 3\}$.

Similarly, the first candidate symbol vector detector 226c of the backward symbol vector detector 226 selects a symbol vector $s_I^1 = [S_1^n, S_1^{n+50}]$ having a minimum Euclidean distance as a candidate symbol vector when the values of the real and imaginary parts of the $S_1^{n+50}$ are in $\{-3, -1, 1, \text{ and } 3\}$. In other words, the candidate symbol vector set $s_I^1 = [S_1^n, S_1^{n+50}]$ includes at least one symbol vector when the values of the real and imaginary parts of $S_1^n$ and $S_1^{n+50}$ are in $\{-3, -1, 1, \text{ and } 3\}$. To select the backward candidate symbol vector, since the candidate symbol vectors are selected such that symbol vectors exist for which the values of the real and imaginary parts of $S_1^n$ and $S_1^{n+50}$ are in $\{-3, -1, 1, \text{ and } 3\}$ without omission, the number of candidate symbol vectors is small as compared with the case of selecting the forward candidate symbol vector. According to an experimental result, an average of 13 candidate symbol vectors are selected.

If the second candidate symbol vector detector 226d of the backward symbol vector detector 226 terminates the detection of the primary backward candidate symbol vector, the second candidate symbol vector detector 226d removes interference by applying Equation 27 to all symbol vectors of the selected candidate symbol vector set.

$$\begin{bmatrix} Z_{I,1}^n \\ Z_{I,1}^{n+50} \end{bmatrix} = \begin{bmatrix} Z_{I,1}^n \\ Z_{I,1}^{n+50} \end{bmatrix} - \begin{bmatrix} R_{I,12}^n & 0 \\ 0 & R_{I,12}^{n+50} \end{bmatrix} \begin{bmatrix} 4 & 1 \\ 1 & -4 \end{bmatrix} \begin{bmatrix} \hat{S}_1^n \\ \hat{S}_1^{n+50} \end{bmatrix} \qquad \text{Equation 27}$$

Equation 27 may be summarized as Equation 28:

$$\begin{bmatrix} Z_{I,1}^n \\ Z_{I,1}^{n+50} \end{bmatrix} = \begin{bmatrix} R_{I,11} & 0 \\ 0 & R_{I,11}^{n+50} \end{bmatrix} \begin{bmatrix} 4 & 1 \\ 1 & -4 \end{bmatrix} \begin{bmatrix} S_2^n \\ S_2^{n+50} \end{bmatrix} + \begin{bmatrix} N_1^n \\ N_1^{n+50} \end{bmatrix}. \qquad \text{Equation 28}$$

The second QR decomposition unit 222e of the preprocessor 222 performs QR decomposition with respect to a portion of Equation 28 corresponding to a channel as expressed by Equation 29:

$$[Q2_I, R2_I] = QR\left\{ \begin{bmatrix} R_{I,11}^n & 0 \\ 0 & R_{I,11}^{n+50} \end{bmatrix} \begin{bmatrix} 4 & 1 \\ 1 & -4 \end{bmatrix} \right\}. \qquad \text{Equation 29}$$

The second candidate symbol vector detector 226d multiplies Equation 28 by a conjugate transpose of $Q2_I$ obtained from Equation 29, that is, a Hermitian matrix, and Equation 28 may be expressed as Equation 30:

$$\begin{bmatrix} Z_{I,1}^n \\ Z_{I,1}^{n+50} \end{bmatrix} = Q2_I^H \begin{bmatrix} Z_{I,1}^n \\ Z_{I,1}^{n+50} \end{bmatrix}$$

$$= \begin{bmatrix} R''_{I,11} & R''_{I,12} \\ 0 & R''_{I,22} \end{bmatrix} \begin{bmatrix} S_2^n \\ S_2^{n+50} \end{bmatrix} + \begin{bmatrix} N_1^n \\ N_1^{n+50} \end{bmatrix}. \qquad \text{Equation 30}$$

The $\hat{S}_2^{n+50}$ of the second column in Equation 30 is detected through a scheme expressed by Equation 31:

$$\hat{S}_2^{n+50} = Q\left( \frac{Z_{I,1}^{n+50}}{R''_{I,22}} \right). \qquad \text{Equation 31}$$

The $\hat{S}_2^n$ is detected by using the detected $\hat{S}_2^{n+50}$ through a scheme expressed by Equation 32:

$$\hat{S}_2^n = Q\left( \frac{Z_{I,1}^n - R''_{I,12} \hat{S}_2^{n+50}}{R''_{I,22}} \right). \qquad \text{Equation 32}$$

The symbol vectors $\hat{S}_2^{n+50}$, $\hat{S}_2^n$, $\hat{S}_1^{n+50}$, and $\hat{S}_1^n$ are formed by detecting $\hat{S}_2^n$ in a final stage. The symbol vector set detected through the inverse process may be expressed as $S_I$ and as Equation 33:

$$[\hat{S}_2^{n+50}, \hat{S}_2^n, \hat{S}_1^{n+50}, \hat{S}_1^n] \in S_I. \qquad \text{Equation 33}$$

The symbol vector set $S_I$ has all symbol vectors, in which the values of real and imaginary parts of the $S_1^n$ and $S_1^{n+50}$ are in {−3, −1, 1, and 3}, without omission. Therefore, in the union $S = S_F \cup S_I$ of the symbol vector set $S_F$ detected in the selection of the forward candidate symbol vector and the symbol vector set $S_I$ detected in the selection of the backward candidate symbol vector, symbol vectors exist for which the values of the real and imaginary parts of $\hat{S}_2^{n+50}$, $\hat{S}_2^n$, $\hat{S}_1^{n+50}$, and $\hat{S}_1^n$ are in {−3, −1, 1, and 3}, without omission.

Accordingly, since an opposite bit value always exists when a soft-decision process is performed, an LLR value may be found.

Figure 5:
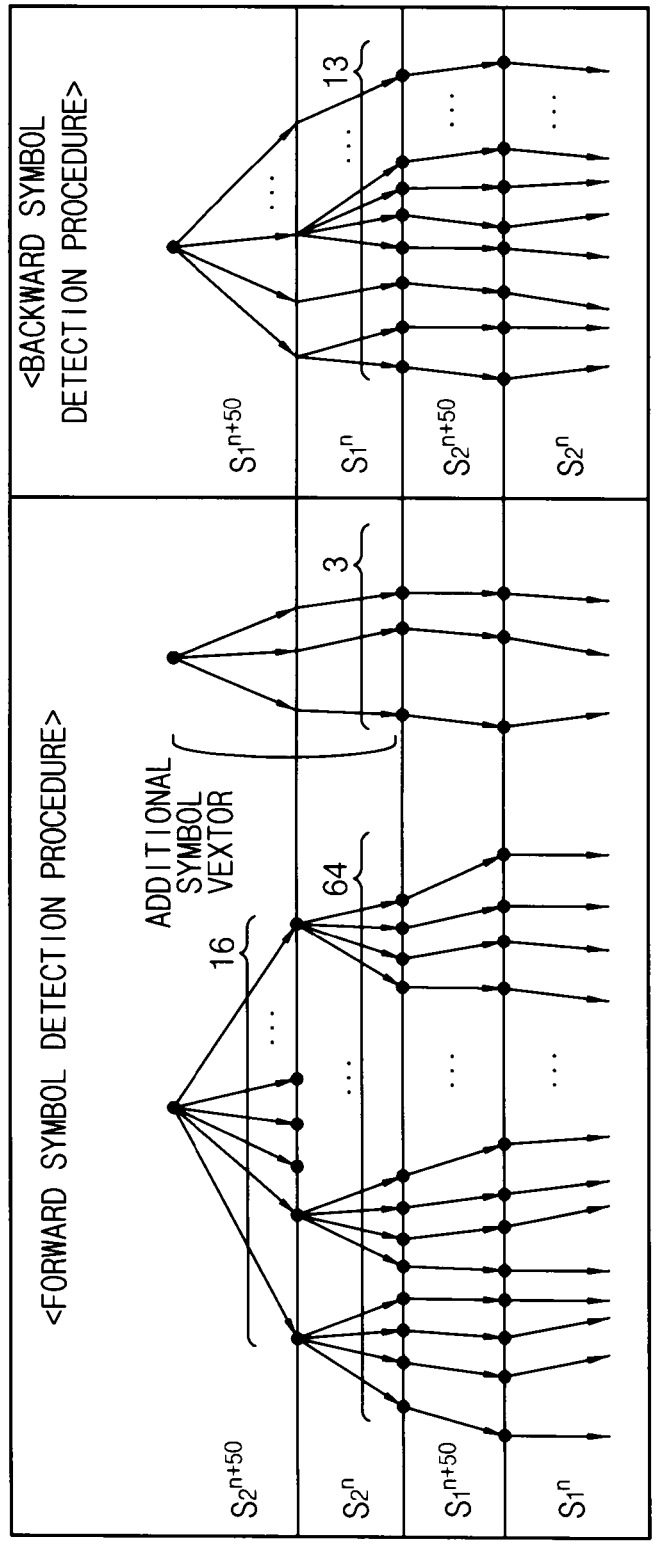
FIG. 5 is a schematic view that illustrates a process of detecting forward and backward symbol vectors.

FIG. 5 is a schematic view that illustrates procedures for detecting the above forward and backward candidate symbol vectors.

3. LLR Calculation

The LLR calculator 228 calculates LLR values for the forward and backward candidate symbol vectors. The calculation of the LLR values may be expressed in Equation 34:

$$LLR(b_k^1) = \min_{s \in S \cap \beta_{1,k}^-} \frac{ED(s)}{2\sigma_n^2} - \min_{s \in S \cap \beta_{1,k}^+} \frac{ED(s)}{2\sigma_n^2} \qquad \text{Equation 34}$$

$$LLR(b_k^2) = \min_{s \in S \cap \beta_{2,k}^-} \frac{ED(s)}{2\sigma_n^2} - \min_{s \in S \cap \beta_{2,k}^+} \frac{ED(s)}{2\sigma_n^2}$$

As expressed by Equation 34, the LLR value is found as a difference between a value that minimizes ED(s) in the intersection of the candidate symbol vector set S and $\beta_{1,k}^-$, and a value that minimizes ED(s) in the intersection of the candidate symbol vector set S and $\beta_{1,k}^+$. According to a method of an exemplary embodiment, since the intersection of the candidate symbol vector set S with either $\beta_{1,k}^-$ or $\beta_{1,k}^+$ is not the empty set, the LLR value can be calculated exactly. The LLR calculator 228 calculates the LLR value using Equation 34 and the union produced in the above procedure and transmits the LLR value to the channel decoder.

The following Table 1 compares the number of required real number multiplication operations in an MDCM detection scheme in a 2×2 MIMO system according to an exemplary embodiment and a MDCM detection scheme based on an ML scheme. Only the real number multiplications are represented in Table 1 since a multiplication has a much greater computational complexity than an addition.

TABLE 1

| Demodulation scheme | Operation | | Real number multiplication operations # |
|---|---|---|---|
| ML | Calculation of Euclidean Distance | | $16^4 \times 8 = 524,288$ |
| Exemplary Embodiment | preprocess | calculation of channel norm | 16 |
| | | Calculation of QR decomposition | complex: 64 × 2 = 128 real: 3 × 2 × 2 = 12 |
| | | Calculation of QR update | complex: 24 × 2 = 48 real: 6 × 2 + 16 × 2 = 48 |
| | Forward process | Calculation of Euclidean distance | 40 + 67 × 2 + 67 × 2 = 308 |
| | Backward process | Calculation of Euclidean distance | 40 + 13 × 2 + 13 × 2 = 92 652 |

According to a detection method of an exemplary embodiment, the multiplication complexity is reduced by 99% as compared with the multiplication complexity of an ML scheme.

Figure 6:
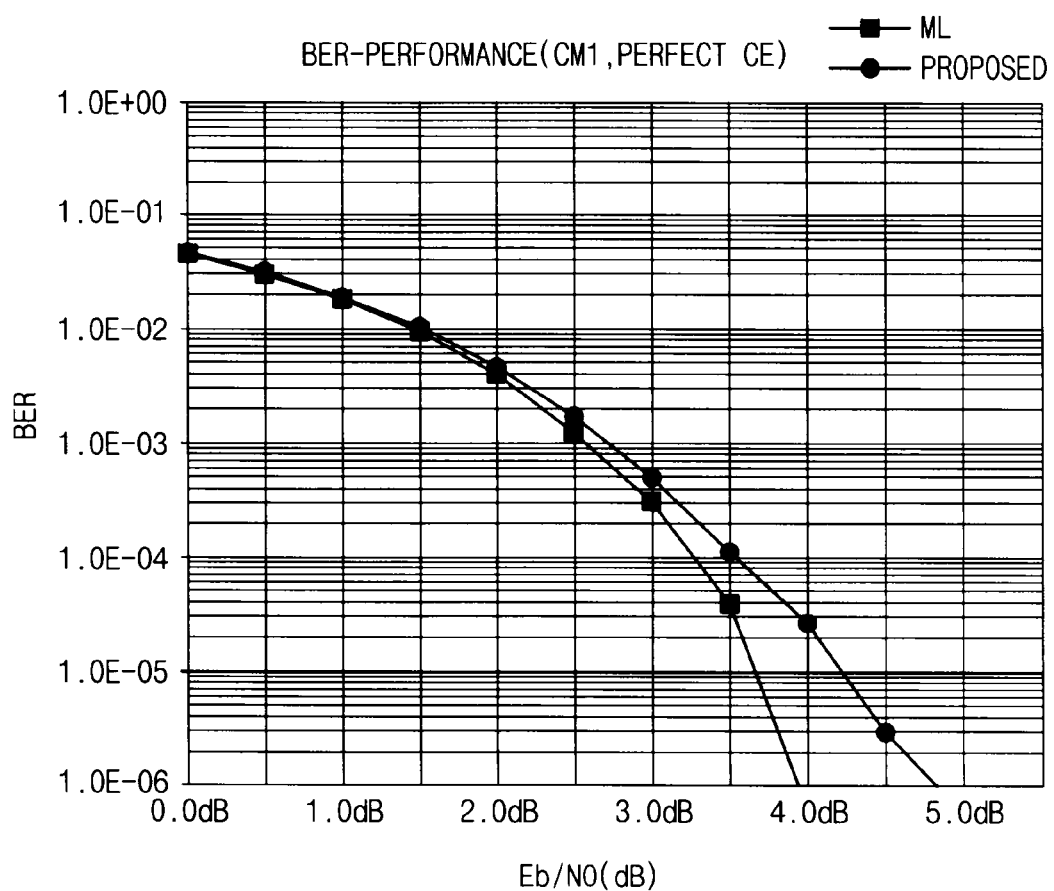
FIG. 6 is a graph that illustrates a bit error rate for a simulation result in a 2048 Mbps transmission mode in a 2×2 MIMO MB-OFDM system in which an MDCM soft-decision detector is applied to a 2×2 MIMO system according to an exemplary embodiment.

FIG. 6 is a graph that illustrates a bit error rate for a simulation result in a 2048 Mbps transmission mode in a 2×2 MIMO MB-OFDM system in which an MDCM soft-decision detector is applied to a 2×2 MIMO system according to an exemplary embodiment. FIG. 7 is a graph that illustrates a packet error rate for the same simulation result as that of FIG. 6. In FIG. 6, the horizontal axis represents the ratio of bit energy to noise power, and the vertical axis represents a coded BER (coded bit error rate). In FIG. 7, the horizontal axis represents the ratio of bit energy to noise power, and the vertical axis represents a coded PER (coded packet error rate).

As illustrated in FIG. 6, an MDCM soft-decision detector in a 2×2 MIMO system according to an exemplary embodiment represents a performance degradation of about 0.5 dB at a bit error rate of about $10^{-5}$ as compared with a ML soft-decision detector. In addition, as illustrated in FIG. 7, an MDCM soft-decision detector in a 2×2 MIMO system represents a performance degradation of about 0.4 dB at a packet error rate of about $10^{-2}$.

Therefore, according to an exemplary embodiment, although the performance of an ML soft-decision detector is slightly degraded, the complexity is reduced by 99% or more.

An exemplary embodiment may be applied to a UWB technology to achieve Gbps performance in a MIMO OFDM system employing an MDCM precoding scheme, and may be extended to a MIMO OFDM system employing real number linear dispersion codes.

The foregoing is illustrative of exemplary embodiments and is not to be construed as limiting thereof. Although a few exemplary embodiments have been described, those skilled in the art will readily appreciate that many modifications are possible in exemplary embodiments without materially departing from the novel teachings of the present inventive concept. Accordingly, all such modifications are intended to be included within the scope of the present inventive concept as defined in the claims. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

What is claimed is:

1. A method for detecting soft-decisions in a 2×2 MIMO system, the method comprising:
   detecting all candidate symbol vector sets S for which there exist all values of a real part and an imaginary part; and
   calculating a log-likelihood ratio (LLR) with respect to the candidate symbol vector sets S from $$LLR(b_k^i) = \min_{s \in S \cap \beta_{i,k}^-} \frac{ED(s)}{2\sigma_n^2} - \min_{s \in S \cap \beta_{i,k}^+} \frac{ED(s)}{2\sigma_n^2},$$

wherein
   $\beta_{i,k}^-$ represents a set having as elements those candidate symbol vectors in set S for which a kth bit of a symbol transmitted through an ith transmitter antenna is 0,
   $\beta_{i,k}^+$ represents a set having as elements those candidate symbol vectors in set S for which the kth bit of the symbol transmitted through the ith transmitter antenna is 1, and
   ED(s) represents a Euclidean distance for an element s of the candidate symbol vector set S.

2. The method of claim 1, wherein each candidate symbol vector set S is a union $S = S_F \cup S_B$ of a forward candidate symbol vector set $S_F$ and a backward candidate symbol vector set $S_B$.

3. The method of claim 2, further comprising
   forward detecting symbols in an order of $[\hat{S}_2^{n+50}, \hat{S}_2^n]$ and $[\hat{S}_1^{n+50}, \hat{S}_1^n]$, and
   backward detecting symbols in an order of $[\hat{S}_1^{n+50}, \hat{S}_1^n]$ and $\hat{S}_2^{n+50}, \hat{S}_2^n$.

4. The method of claim 3, wherein forward detecting and backward detecting are performed on a 2×2 matrix based on candidate symbol vector pairs $[\hat{S}_2^{n+50}, \hat{S}_2^n]$ and $[\hat{S}_1^{n+50}, \hat{S}_1^n]$, respectively.

5. The method of claim 3, wherein forward detecting comprises:
   selecting p symbols for $\hat{S}_2^{n+50}$;
   selecting q $\hat{S}_2^n$ symbols for each of the p $\hat{S}_2^{n+50}$ symbols to select total p×q $\hat{S}_2^n$ symbols;
   selecting r additional $\hat{S}_2^n$ symbols;
   selecting one $\hat{S}_1^{n+50}$ symbol for each of the p×q+r $\hat{S}_2^n$ symbols to select p×q+r total $\hat{S}_1^{n+50}$ symbols; and
   selecting one $\hat{S}_1^n$ symbol for each of the p×q+r $\hat{S}_1^{n+50}$ symbols to select p×q+r total $\hat{S}_1^n$ symbols.

6. The method of claim 5, wherein forward detecting the candidate symbol vector pair $[\hat{S}_2^{n+50}, \hat{S}_2^n]$ comprises:
   converting a received signal comprising the candidate symbol vector pair $[\hat{S}_2^{n+50}, \hat{S}_2^n]$ into an upper triangular matrix by applying a conjugate transpose of a matrix obtained through QR decomposition to the received signal;
   calculating a Euclidean distance for all cases of the candidate symbol vector pair $[\hat{S}_2^{n+50}, \hat{S}_2^n]$;
   selecting L $\hat{S}_2^n$ symbols for the $\hat{S}_2^{n+50}$ from symbol vector pairs $[\hat{S}_2^{n+50}, \hat{S}_2^n]$;
   determining if values of the real part and the imaginary part exist in the selected $\hat{S}_2^n$ symbols; and
   selecting an additional $\hat{S}_2^n$ symbol that minimizes the calculated Euclidean distance with respect to a $\hat{S}_2^n$ symbol for which the values of the real part and the imaginary part are absent.

7. The method of claim 6, further comprising performing channel ordering for the received signal before forward detecting the candidate symbol vector pair, and applying the conjugate transpose of the matrix obtained through the QR decomposition of a channel matrix to the received signal to convert the received signal to the upper triangular matrix.

8. The method of claim 6, wherein forward detecting the candidate symbol vector pair $[\hat{S}_1^{n+50}, \hat{S}_1^n]$ comprises:
   applying the conjugate transpose of the matrix obtained through the QR decomposition to the received signal comprising the symbol vector pair $[\hat{S}_1^{n+50}, \hat{S}_1^n]$ to convert the received signal into the upper triangular matrix;
   selecting $\hat{S}_1^{n+50}$ symbols from symbol vector pairs $[\hat{S}_1^{n+50}, \hat{S}_1^n]$; and
   selecting a $\hat{S}_1^n$ symbol with respect to each of the selected $\hat{S}_1^{n+50}$ symbols.

9. The method of claim 8, further comprising removing channel interference caused by the selected candidate symbol vector pairs $[\hat{S}_2^{n+50}, \hat{S}_2^n]$ before forward detecting the candidate symbol vector pair $[\hat{S}_1^{n+50}, \hat{S}_1^n]$, and performing channel ordering for the symbol vector pair $[\hat{S}_1^{n+50}, \hat{S}_1^n]$.

10. The method of claim 3, wherein backward detecting comprises:
   selecting s symbols for $\hat{S}_1^n$ of the symbol vector pair $[\hat{S}_1^{n+50}, \hat{S}_1^n]$;
   selecting one $\hat{S}_2^{n+50}$ symbol for each of the s $\hat{S}_1^n$ symbols to select s total $\hat{S}_2^{n+50}$ symbols; and
   selecting one $\hat{S}_2^n$ symbol for each of the s $\hat{S}_2^{n+50}$ symbols to select s total $\hat{S}_2^n$ symbols.

11. The method of claim 10, wherein backward detecting the candidate symbol vector pair $[\hat{S}_1^{n+50}, \hat{S}_1^n]$ comprises:
   converting a received signal comprising the candidate symbol vector pair $[\hat{S}_1^{n+50}, \hat{S}_1^n]$ to an upper triangular matrix by applying a conjugate transpose of a matrix obtained through QR decomposition to the received signal;
   calculating a Euclidean distance for all cases of the candidate symbol vector pair $[\hat{S}_1^{n+50}, \hat{S}_1^n]$; and
   selecting an $\hat{S}_1^n$ symbol that minimizes the calculated Euclidean distance with respect to each of $\hat{S}_1^n$ symbols for which there exists values of the real part and the imaginary part.

12. The method of claim 11, further comprising performing channel ordering for the received signal before backward detecting the candidate symbol vector pair, and applying the conjugate transpose of the matrix obtained through the QR decomposition of a channel matrix to the received signal to convert the received signal to the upper triangular matrix.

13. The method of claim 11, wherein backward detecting the candidate symbol vector pair $[\hat{S}_2^{n+50}, \hat{S}_2^n]$ comprises:
   applying the conjugate transpose of the matrix obtained through the QR decomposition to the received signal including the symbol vector pair $[\hat{S}_2^{n+50}, \hat{S}_2^n]$ to convert the received signal to the upper triangular matrix;
   selecting $\hat{S}_2^{n+50}$ symbols from symbol vector pairs $[\hat{S}_2^{n+50}, \hat{S}_2^n]$; and
   selecting an $\hat{S}_2^n$ symbol with respect to each of the selected $\hat{S}_2^{n+50}$ symbols.

14. The method of claim 13, further comprising removing channel interference caused by the selected candidate symbol vector pairs $[\hat{S}_1^{n+50}, \hat{S}_1^n]$ before backward detecting the candidate symbol vector pairs $[\hat{S}_2^{n+50}, \hat{S}_2^n]$, and performing channel ordering for the symbol vector pair $[\hat{S}_1^{n+50}, \hat{S}_1^n]$.

15. An apparatus for soft-decision detection in a 2×2 MIMO system, the apparatus comprising:
   a preprocessor configured to perform channel ordering, remove interference, and to perform QR decomposition with respect to a channel matrix of a received signal;
   a forward symbol vector detector configured to detect a symbol vector set $S_F$ comprising all candidate symbols, wherein values of a real part and an imaginary part exist with respect to a first symbol pair according to a forward order based on a result of a forward QR decomposition of the preprocessor;
   a backward symbol vector detector configured to detect a symbol vector set $S_B$ comprising all candidate symbols, wherein values of a real part and an imaginary part exist with respect to a second symbol pair according to a backward order based on a result of a backward QR decomposition of the preprocessor; and
   a log-likelihood ratio calculator configured to calculate a log-likelihood ratio with respect to all candidate symbol vector sets $S=S_F \cup S_B$ from $$LLR(b_k^i) = \min_{s \in S \cap \beta_{i,k}^-} \frac{ED(s)}{2\sigma_n^2} - \min_{s \in S \cap \beta_{i,k}^+} \frac{ED(s)}{2\sigma_n^2},$$

wherein $\beta_{i,k}^-$ represents a set having as elements those candidate symbol vectors in set S for which a kth bit of a symbol transmitted through an ith transmitter antenna is 0, $\beta_{i,k}^+$ represents a set having as elements those candidate symbol vectors in set S for which the kth bit of the symbol transmitted through the ith transmitter antenna is 1, and ED(s) represents a Euclidean distance for an element s of the candidate symbol vector set S.

16. A method for detecting soft-decisions in a 2×2 MIMO system, the method comprising:
   receiving an OFDM-modulated signal by a MIMO-OFDM reception device;
   detecting all candidate symbol vector sets S in the OFDM-modulated signal for which there exist all values of a real part and an imaginary part, wherein each candidate symbol vector set S is a union $S=S_F \cup S_B$, of a forward candidate symbol vector set $S_F$ and a backward candidate symbol vector set $S_B$;
   forward detecting symbols in an order of $[\hat{S}_2^{n+50}, \hat{S}_2^n]$ and $[\hat{S}_1^{n+50}, \hat{S}_1^n]$, and
   backward detecting symbols in an order of $[\hat{S}_1^{n+50}, \hat{S}_1^n]$ and $[\hat{S}_2^{n+50}, \hat{S}_2^n]$,
   wherein forward detecting and backward detecting are performed on a 2×2 matrix based on candidate symbol vector pairs $[\hat{S}_2^{n+50}, \hat{S}_2^n]$ and $[\hat{S}_1^{n+50}, \hat{S}_1^n]$, respectively,
   wherein the steps of detecting all candidate symbol vector sets S, forward detecting symbols, and backward detecting symbols are performed by the MIMO-OFDM reception device.

17. The method of claim 16, further comprising calculating a log-likelihood ratio (LLR) with respect to the candidate symbol vector sets S from $$LLR(b_k^i) = \min_{s \in S \cap \beta_{i,k}^-} \frac{ED(s)}{2\sigma_n^2} - \min_{s \in S \cap \beta_{i,k}^+} \frac{ED(s)}{2\sigma_n^2},$$

wherein $\beta_{i,k}^-$ represents a set having as elements those candidate symbol vectors in set S for which a kth bit of a symbol transmitted through an ith transmitter antenna is 0, $\beta_{i,k}^+$ represents a set having as elements those candidate symbol vectors in set S for which the kth bit of the symbol transmitted through the ith transmitter antenna is 1, and ED(s) represents a Euclidean distance for an element s of the candidate symbol vector set S.

18. The method of claim 16, wherein forward detecting candidate symbol vector pair $[\hat{S}_2^{n+50}, \hat{S}_2^n]$ comprises
   converting the OFDM-modulated signal comprising the candidate symbol vector pair $[\hat{S}_2^{n+50}, \hat{S}_2^n]$ into an upper triangular matrix by applying a conjugate transpose of a matrix obtained through QR decomposition to the received signal,
   calculating a Euclidean distance for all cases of the candidate symbol vector pair $[\hat{S}_2^{n+50}, \hat{S}_2^n]$,
   selecting L $\hat{S}_2^n$ symbols for the $\hat{S}_2^{n+50}$ from symbol vector pairs $[\hat{S}_2^{n+50}, \hat{S}_2^n]$,
   determining if values of the real part and the imaginary part exist in the selected $\hat{S}_2^n$ symbols, and
   selecting an additional $\hat{S}_2^n$ symbol that minimizes the calculated Euclidean distance with respect to a $\hat{S}_2^n$ symbol for which the values of the real part and the imaginary part are absent,
   and forward detecting the candidate symbol vector pair $[\hat{S}_1^{n+50}, \hat{S}_1^n]$ comprises
   applying the conjugate transpose of the matrix obtained through the QR decomposition to the received signal comprising the symbol vector pair $[\hat{S}_1^{n+50}, \hat{S}_1^n]$ to convert the received signal into the upper triangular matrix,
   selecting $\hat{S}_1^{n+50}$ symbols from symbol vector pairs $[\hat{S}_1^{n+50}, \hat{S}_1^n]$, and
   selecting a $\hat{S}_1^n$ symbol with respect to each of the selected $\hat{S}_1^{n+50}$ symbols.

19. The method of claim 16, wherein backward detecting the candidate symbol vector pair $[\hat{S}_1^{n+50}, \hat{S}_1^n]$ comprises converting the OFDM-modulated signal comprising the candidate symbol vector pair $[\hat{S}_1^{n+50}, \hat{S}_1^n]$ to an upper triangular matrix by applying a conjugate transpose of a matrix obtained through QR decomposition to the received signal, calculating a Euclidean distance for all cases of the candidate symbol vector pair $[\hat{S}_1^{n+50}, \hat{S}_1^n]$, and selecting an $\hat{S}_1^n$ symbol that minimizes the calculated Euclidean distance with respect to each of $\hat{S}_1^n$ symbols for which there exists values of the real part and the imaginary part, and wherein backward detecting the candidate symbol vector pair $[\hat{S}_2^{n+50}, \hat{S}_2^n]$ comprises applying the conjugate transpose of the matrix obtained through the QR decomposition to the received signal including the symbol vector pair $[\hat{S}_2^{n+50}, \hat{S}_2^n]$ to convert the received signal to the upper triangular matrix, selecting $\hat{S}_2^{n+50}$ symbols from symbol vector pairs $[\hat{S}_2^{n+50}, \hat{S}_2^n]$, and selecting an $\hat{S}_2^n$ symbol with respect to each of the selected $\hat{S}_2^{n+50}$ symbols.

\* \* \* \* \*